(12) United States Patent
Poolla et al.

(10) Patent No.: US 9,411,688 B1
(45) Date of Patent: Aug. 9, 2016

(54) SYSTEM AND METHOD FOR SEARCHING MULTIPLE BOOT DEVICES FOR BOOT IMAGES

(71) Applicant: Xilinx, Inc., San Jose, CA (US)

(72) Inventors: Ramakrishna G. Poolla, Hyderabad (IN); Yatharth K. Kochar, Hyderabad (IN); Krishna C. Patakamuri, Hyderabad (IN)

(73) Assignee: XILINX, INC., San Jose, CA (US)

( * ) Notice: Subject to any disclaimer, the term of this patent is extended or adjusted under 35 U.S.C. 154(b) by 285 days.

(21) Appl. No.: 14/103,723

(22) Filed: Dec. 11, 2013

(51) Int. Cl.
*G06F 11/14* (2006.01)
*H03K 19/177* (2006.01)

(52) U.S. Cl.
CPC ...... *G06F 11/1417* (2013.01); *H03K 19/17764* (2013.01)

(58) Field of Classification Search
CPC ............... G06F 11/1417; H03K 19/17764
See application file for complete search history.

(56) References Cited

U.S. PATENT DOCUMENTS

| | | | |
|---|---|---|---|
| 6,446,203 B1 | 9/2002 | Aguilar et al. | |
| 6,781,407 B2 | 8/2004 | Schultz | |
| 7,199,608 B1 | 4/2007 | Trimberger | |
| 7,301,822 B1 | 11/2007 | Walstrum, Jr. et al. | |
| 7,328,335 B1 | 2/2008 | Sundararajan et al. | |
| 7,420,392 B2 | 9/2008 | Schultz et al. | |
| 7,425,843 B1 | 9/2008 | Edwards et al. | |
| 7,576,561 B1 | 8/2009 | Huang | |
| 7,631,223 B1* | 12/2009 | Spinti ................ | G06F 11/1417 714/27 |
| 7,653,820 B1 | 1/2010 | Trimberger | |
| 7,689,726 B1 | 3/2010 | Sundararajan et al. | |
| 9,152,794 B1 | 10/2015 | Sanders et al. | |
| 9,165,143 B1 | 10/2015 | Sander et al. | |
| 9,230,112 B1 | 1/2016 | Peterson et al. | |
| 2004/0078679 A1* | 4/2004 | Cagle ................... | G06F 9/4406 714/36 |
| 2004/0153724 A1 | 8/2004 | Nicholson et al. | |
| 2005/0125396 A1 | 6/2005 | Liu | |
| 2006/0026429 A1 | 2/2006 | Kudo et al. | |
| 2007/0038685 A1 | 2/2007 | Chan et al. | |
| 2008/0141017 A1 | 6/2008 | McCoull et al. | |
| 2008/0256366 A1 | 10/2008 | Dale et al. | |
| 2009/0089570 A1 | 4/2009 | Andrianov | |
| 2009/0204803 A1 | 8/2009 | Cox et al. | |
| 2009/0288160 A1* | 11/2009 | Esliger ................. | G06F 21/575 726/17 |
| 2009/0327680 A1 | 12/2009 | Dale et al. | |

(Continued)

OTHER PUBLICATIONS

Elinux.org, "RPi U-Boot," *Embedded Linux Wiki*, Dec. 2, 2012, web Feb. 18, 2014, <http://elinux.org/index.php?title=RPi_U-boot &oldid=197048&print>.
Huang, Andrew, "Keeping Secrets in Hardware: the Microsoft Xbox Case Study," AI Memo 2002-008, May 26, 2001, pp. 1-15, Massachusetts Institute of Technology, Artificial Intelligence Lab, Cambridge, Massachusetts, USA.
U.S. Appl. No. 13/775,151, filed Feb. 23, 2013, Peterson et al.
U.S. Appl. No. 13/833,177, filed Mar. 15, 2013, Sanders et al.

(Continued)

*Primary Examiner* — Albert Wang
(74) *Attorney, Agent, or Firm* — LeRoy D. Maunu; Jonathan Soike

(57) ABSTRACT

In some disclosed implementations, a system-on-chip on a first IC die includes a boot loader circuit configured to search a first boot device, of a plurality of boot devices coupled to and external to the first IC die, for an uncorrupt boot image. The boot loader circuit is configured to search a second boot device of the plurality of boot devices for an uncorrupt boot image, in response to failing to find an uncorrupt boot image in the first boot device. The boot loader is also configured to load a set of instructions included in the uncorrupt boot image into a memory circuit of the SOC, in response to finding an uncorrupt boot image.

19 Claims, 4 Drawing Sheets

(56) References Cited

U.S. PATENT DOCUMENTS

| | | |
|---|---|---|
| 2010/0070749 A1 | 3/2010 | Tsai |
| 2010/0241837 A1 | 9/2010 | Concorso |
| 2011/0265183 A1 | 10/2011 | Wu et al. |
| 2012/0191960 A1 | 7/2012 | Piwonka et al. |
| 2012/0210115 A1 | 8/2012 | Park et al. |
| 2013/0042098 A1 | 2/2013 | Baik et al. |
| 2013/0185563 A1 | 7/2013 | Djabarov et al. |
| 2013/0282951 A1 | 10/2013 | Kuo et al. |
| 2014/0237223 A1* | 8/2014 | Chudgar ............... G06F 9/4408 713/2 |
| 2014/0281455 A1 | 9/2014 | Kochar |
| 2015/0106609 A1 | 4/2015 | Koszek |

OTHER PUBLICATIONS

U.S. Appl. No. 14/019,323, filed Sep. 5, 2013, Sanders et al.

Xilinx, Inc., *Zynq-7000 All Programmable SoC Software Developers Guide*, UG821 (v3.0), Oct. 16, 2012, pp. 1-42, Xilinx, Inc., San Jose, California, USA.

Xilinx, Inc., *Zynq-7000 All Programmable SoC Technical Reference Manual*, UG585 (v1.4), Nov. 16, 2012, Chapters 6, 27, 28, 32 (76 pages), Xilinx, Inc., San Jose, California, USA.

Xilinx, *Zynq-7000 All Programmable SoC*, Technical Reference Guide, UG585 v1.5, Mar. 7, 2013, pp. 1-1770, Xilinx, Inc., San Jose, California, USA.

U.S. Appl. No. 14/527,709, filed Oct. 29, 2014, Kochar et al.

\* cited by examiner

SYSTEM AND METHOD FOR SEARCHING MULTIPLE BOOT DEVICES FOR BOOT IMAGES

FIELD OF THE INVENTION

The disclosure generally relates to initialization of programmable integrated circuits (ICs), and more particularly to the searching of boot devices connected to an IC for boot images.

BACKGROUND

An embedded system, in general, refers to a combination of hardware and software that is specifically designed for a particular application or purpose. One example of a hardware platform that can be used to implement an embedded system is a programmable IC. Some programmable ICs include a processor capable of executing program code and provide a particularly robust platform upon which an embedded system can be built.

Prior to use within any specific application, a programmable IC must undergo a configuration process, where programmable resources of the programmable IC are configured with a configuration data stream, such as a bitstream, that specifies a configuration of the hardware resources that implement a particular circuit design. Programmable ICs that include a processor, such as system-on-chip (SOC) devices, must also undergo a boot process to load a set of processor instructions into an integrated memory disposed on the programmable IC. For instance, the boot process may load a set of processor instructions of an operating system into the memory at startup. For ease of reference, configuration and boot processes may be referred to as initialization processes herein. Also, initialization data may be used to generally refer to either processor instructions for initialization of a processor and/or a configuration data stream for initialization of programmable resources of a programmable IC.

During the initialization processes, initialization circuits cause the programmable IC to locate and retrieve a boot image including initialization data from a designated peripheral boot device having initialization data stored in a non-volatile memory. The initialization circuits may include, for example, a boot loader circuit and/or configuration control circuit. The initialization circuitry uses the initialization data to configure the programmable IC. For example, the initialization circuits may copy a set of processor instructions in the retrieved boot image to an internal volatile memory (RAM) for execution by the processor. However, the boot image stored in the boot device may be corrupt or may be otherwise unretrievable, thereby preventing the programmable IC from initializing at startup.

One previous approach mitigates the problems presented by corrupt boot images by storing master and backup boot images on the designated boot device. In response to the master boot image being corrupt, the initialization circuit uses the backup boot image on the designated boot device to initialize the programmable IC. In this manner, adverse effects of a corrupt master boot image are mitigated. This initialization process can be implemented with little additional circuitry and space on the programmable IC because the initialization circuit is already configured to retrieve data files from the designated boot device. Due to the limited space available on programmable ICs, this approach is particularly advantageous.

SUMMARY

One example IC is a SOC that includes programmable hardware resources and a configuration control circuit disposed on a first IC die. The configuration control circuit is configured to program the programmable hardware resources with a configuration data stream in response to the configuration data stream. The SOC device also includes a memory circuit and a processor disposed on the first IC die. The processor is coupled to the memory circuit and programmable hardware resources, and is configured to retrieve and execute instructions from the memory circuit and communicate data with the programmable hardware resources. A boot loader circuit is also disposed on the first IC die. The boot loader circuit is configured to search a first boot device, of a plurality of boot devices coupled to and external to the first IC die, for an uncorrupt boot image. The boot loader circuit is configured to search a second boot device of the plurality of boot devices for an uncorrupt boot image, in response to failing to find an uncorrupt boot image in the first boot device. The boot loader is also configured to load a set of instructions included in the uncorrupt boot image into the memory circuit, in response to finding an uncorrupt boot image.

Another example IC described herein, includes programmable hardware resources and a configuration controller disposed on a first IC die. The configuration control circuit is configured to, in response to a configuration data stream, program the programmable hardware resources with the configuration data stream. A boot loader circuit is disposed on the first IC die. At power-on of the IC, the boot loader is configured to search a first boot device, of a plurality of boot devices disposed on respective IC dies coupled to the first IC die, for an uncorrupt boot image. The boot loader is configured to search a second boot device, of the plurality of boot devices, for an uncorrupt boot image in response to failing to find an uncorrupt boot image in the first boot device. The boot loader is also configured to provide a configuration data stream, included in the uncorrupt boot image, to the configuration control circuit in response to finding an uncorrupt boot image.

A method of configuring a SOC having programmable hardware resources, a processor, and a memory is also described. Using a boot loader circuit disposed on the programmable IC, a plurality of boot devices disposed on respective ICs and coupled to the first IC are searched for a valid boot image. More specifically, a first boot device is searched for an uncorrupt boot image. In response to failing to find an uncorrupt boot image in the first boot device, a second boot device is searched for an uncorrupt boot image. In response to finding an uncorrupt boot image, a set of instructions included in the uncorrupt boot image is loaded into the memory. Using the processor, the set of instructions loaded into the memory are retrieved and executed.

It will be appreciated that variations of the semiconductor devices and method are set forth in the Detailed Description and Claims, which follow.

BRIEF DESCRIPTION OF THE DRAWINGS

Various aspects and features of the circuits and methods will become apparent upon review of the following detailed description and upon reference to the drawings in which.

DETAILED DESCRIPTION OF THE DRAWINGS

Figure 1:
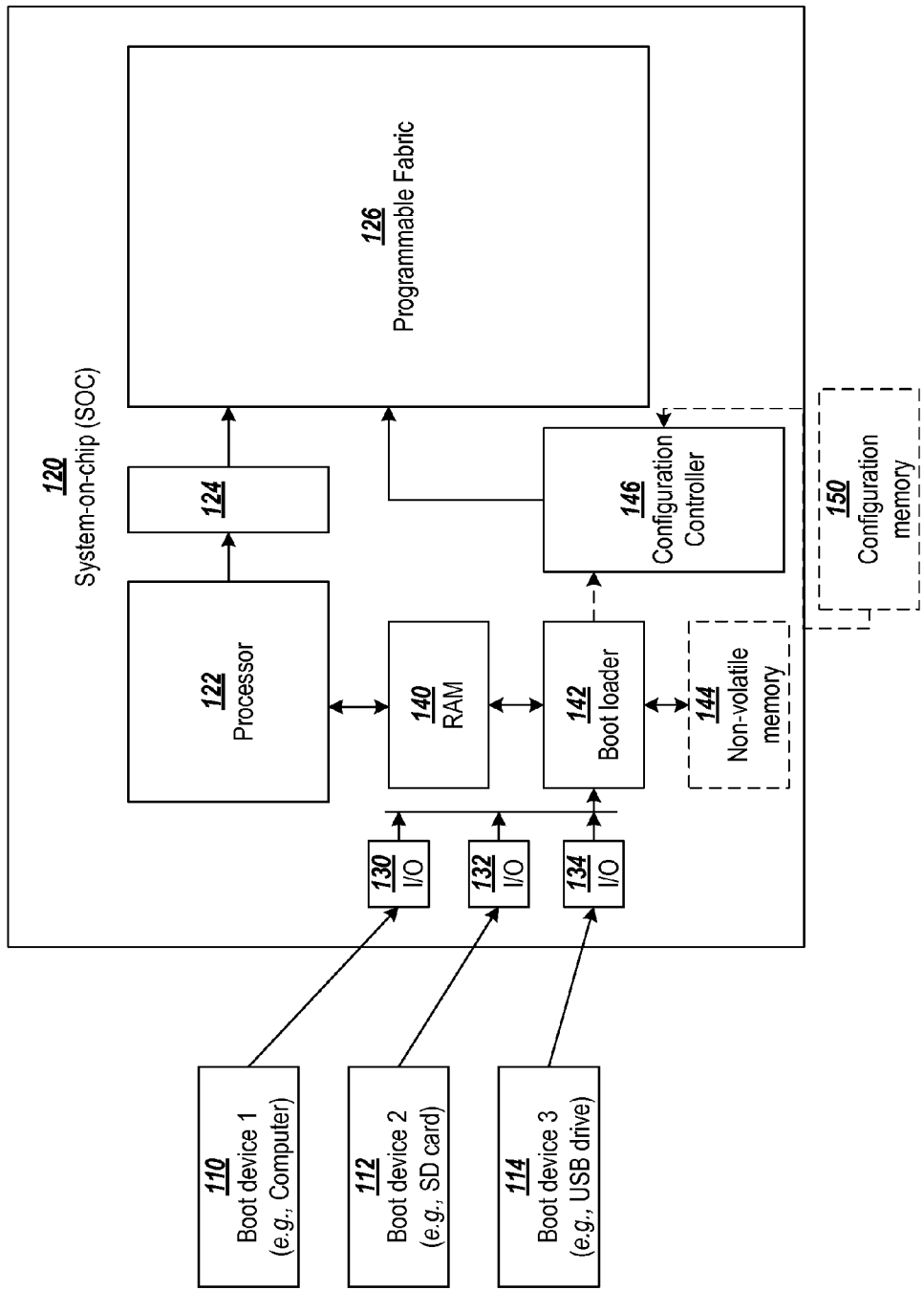
FIG. 1 shows a system-on-chip having a boot loader circuit.

In one or more applications, a programmable IC includes a boot loader circuit configured to automatically search a plurality of boot devices at start-up for an uncorrupt boot image including initialization data, such as, a set of processor instructions and/or a configuration data stream. In some implementations, a boot loader circuit is configured to retrieve a boot image from a first designated boot device, and in response to being unable to find a boot image on the first designated boot device, search one or more other boot devices connected to the programmable IC for an uncorrupt boot image.

In some implementations, the boot loader circuit is configured to automatically detect and search boot devices connected to the programmable IC for a valid boot image. The boot loader circuit may be configured to detect and prioritize searching of boot devices based on various characteristics of the boot devices. For instance, the boot loader circuit may reduce start-up time by prioritizing boot devices having higher transfer speeds.

In some implementations, the boot loader circuit is configured to search the plurality of boot devices in an order indicated in a settings file stored in a non-volatile memory. The non-volatile memory may be disposed on the programmable IC or may be disposed on an external IC, such as one of the boot devices connected to the programmable IC. For ease of reference, the order in which the boot devices are searched may be referred to as a boot order.

In some implementations, the boot order specified by the settings file may be adjusted in response to user input. Configuration of the boot order may be useful as a security measure to prevent an end-user from loading an unauthorized boot image by connecting an unauthorized boot device. The boot loader circuit may further improve security by disabling adjustment of the boot order in the configuration settings file, in response to user input. For instance, the boot loader circuit may be configured to prevent modification of the boot order in response to an e-fuse being programmed to interrupt current. Alternatively, modification to the boot order may be prevented by storing the boot order in a write-once memory, such as an e-fuse memory.

The disclosed examples are applicable to initialization of a variety of programmable circuits, such as programmable hardware resources and/or processors, on a programmable IC. In some implementations, a boot image retrieved by a boot loader circuit includes a configuration data stream for initialization of programmable hardware resources of a programmable IC. A configuration data stream provided in a boot image may be used for configuration of programmable ICs with processors or without processors. For a programmable IC having a processor, a boot image may include a configuration data stream for initialization of programmable hardware and/or a set of processor instructions for initialization of the processor.

For instance, in some implementations, the boot image may be used for initialization of the processor but not for initialization of programmable hardware resources. In some other implementations, the boot image may be used for initialization of programmable hardware resources but not for initialization of the processor. In some other implementations, the boot image may be used for initialization of both programmable hardware resources and the processor. For ease of explanation, some examples may be primarily described with reference to initialization of a processor included on a programmable IC. It is understood that such examples may alternatively/additionally be adapted for initialization of programmable resources of a programmable IC.

FIG. 1 shows a system-on-chip having a boot loader circuit. The system-on-chip 120 is disposed on a first IC die and includes a set of programmable hardware resources 126 and a processor 122. The processor is configured to retrieve and execute processor instructions from a memory 140, which is also disposed on the first IC die. A configuration controller 146 is configured to program the programmable hardware resources to implement a circuit specified by a configuration data stream. The processor may be configured to communicate data with circuits implemented by the programmable hardware resources via a communication interface 124.

The system-on-chip 120 includes a boot loader circuit 142 configured to retrieve a boot image from multiple different boot devices external to the first IC die, and connected to respective input/output (I/O) ports 130, 132, and 134 of the system-on-chip. In this example, a computer 110, an SD card 112, and a USB drive 114 are respectively connected to the I/O ports 130, 132, and 134. The plurality of boot devices may include various types of non-volatile memory including, but not limited to, quad serial peripheral interface (SPI), flash memory, NAND memory, NOR memory, battery-backed memory, and SD card memory. In some implementations, different ones of the boot devices communicate data using different communication protocols and interfaces including, for example, PCIe, ISA, Serial ATA, JTAG Ethernet, 802.11, and Bluetooth.

The boot loader circuit 142 is configured to automatically search multiple boot devices at start-up for an uncorrupt boot image including initialization data. In some implementations, the boot loader circuit 142 is configured to retrieve a boot image on a first designated boot device, such as device 110, and in response to being unable to find a viable boot image on the first designated boot device, search one or more other boot devices, such as devices 112 and 114, for an uncorrupt boot image.

In response to retrieving an uncorrupt boot image, the boot loader circuit 142 copies the boot image, such as a set of processor instructions that implements an operating system, into RAM 140. Additionally, the boot loader circuit 142 may also provide a configuration data stream included in the boot image to configuration controller 146. Alternatively, the configuration controller 146 may retrieve a configuration data stream from an external configuration memory 150 without assistance from the boot loader circuit 142.

In some implementations, the boot order may be adjusted dynamically at runtime based on various characteristics of boot devices connected to the system-on-chip. For instance, in some implementations, the boot loader circuit 142 is configured to detect and prioritize searching of boot devices based on transfer speed, error-rate, and/or statuses of the boot devices.

In some other implementations, the boot loader circuit 142 is configured to search the plurality of boot devices in a predetermined boot order indicated in a settings file stored in a non-volatile memory. The boot order may be stored in a non-volatile memory 144 on the system-on-chip or may be stored in a non-volatile memory external to the system-on-chip. For instance, the boot order may be stored on one of the boot devices connected to the system-on-chip.

In some implementations, the boot order specified by the settings file may be adjusted in response to user input. As indicated above, configuration of the boot order may be useful as a security measure to prevent an end-user from loading an unauthorized boot image by connecting a new boot device. Authentication techniques, such as password and/or encryption, may be performed prior to allowing a user to adjust the boot order. The boot loader circuit 142 may also be configured to disable adjustment of the boot order in the configuration settings file, in response to user input. For instance, in one implementation, the boot loader circuit 142 is configured to prevent modification of the boot order in response to an e-fuse being programmed to block current.

Figure 2:
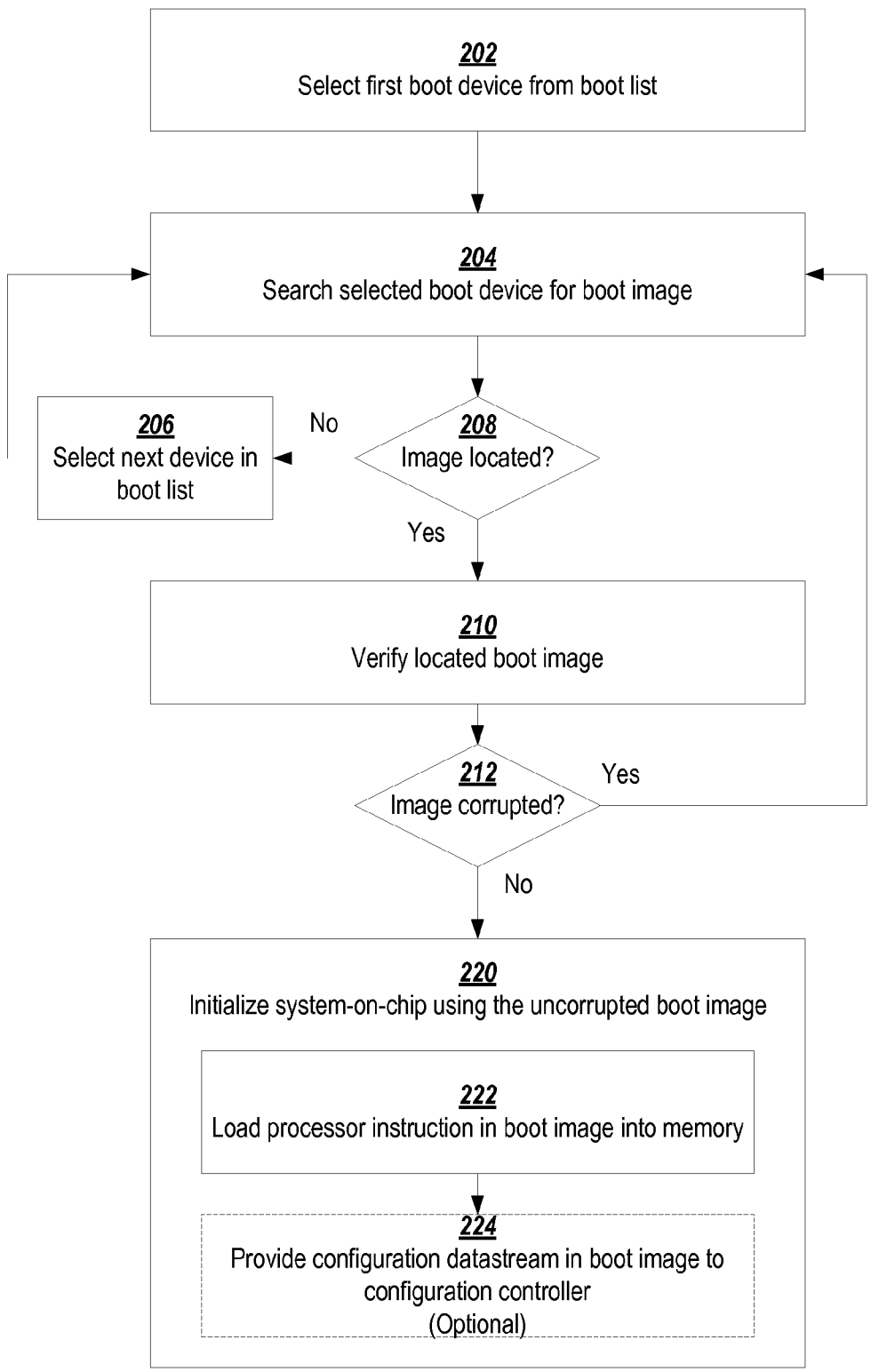
FIG. 2 shows a flowchart of a process for configuration of a system-on-chip.

FIG. 2 shows a flowchart of a process for configuration of a system-on-chip. At block 202, a first, or master, boot device is selected from a boot list. The selected boot device is searched at block 204 for a boot image. If no boot image is located, decision block 208 causes the next device in the boot list to be selected at block 206. The selected boot device is searched for a boot image at block 204. This process repeats until either a boot image is located or all boot devices have been searched.

If a boot image is located in a selected boot device, decision block 208 causes the process to verify the located boot image is uncorrupt at block 210. Various methods may be used to verify that a boot image is uncorrupt. For example, in one implementation, a boot loader circuit may calculate a checksum for a header of the boot image and compare the calculated checksum to a value included in the header. Various implementations may utilize a number of different algorithms to compute the checksum including, but not limited to, cyclic-redundancy-check (CRC), message-digest (MD), SHA, and/or Keccak. Alternatively or additionally, a checksum may be calculated and verified for a data portion of the boot image. The checksum of the data portion may be verified in response to determining that the checksum of the header is uncorrupt. In some implementations, signature authentication may additionally or alternatively be performed to verify integrity or origin of a boot image. Other verification methods may also be used.

If the boot image is determined to be corrupt at decision block 212, the search for a boot image is continued at block 204 on the same or on another boot device. If the image is not corrupt at decision block 212, the system-on-chip is initialized using the uncorrupt boot image at block 220. As part of the initialization process 220, a set of processor instructions included in the boot image is loaded into a memory of the system-on-chip at block 222. In some implementations, a configuration data stream included in the boot image is provided to a configuration controller at block 224.

Figure 3:
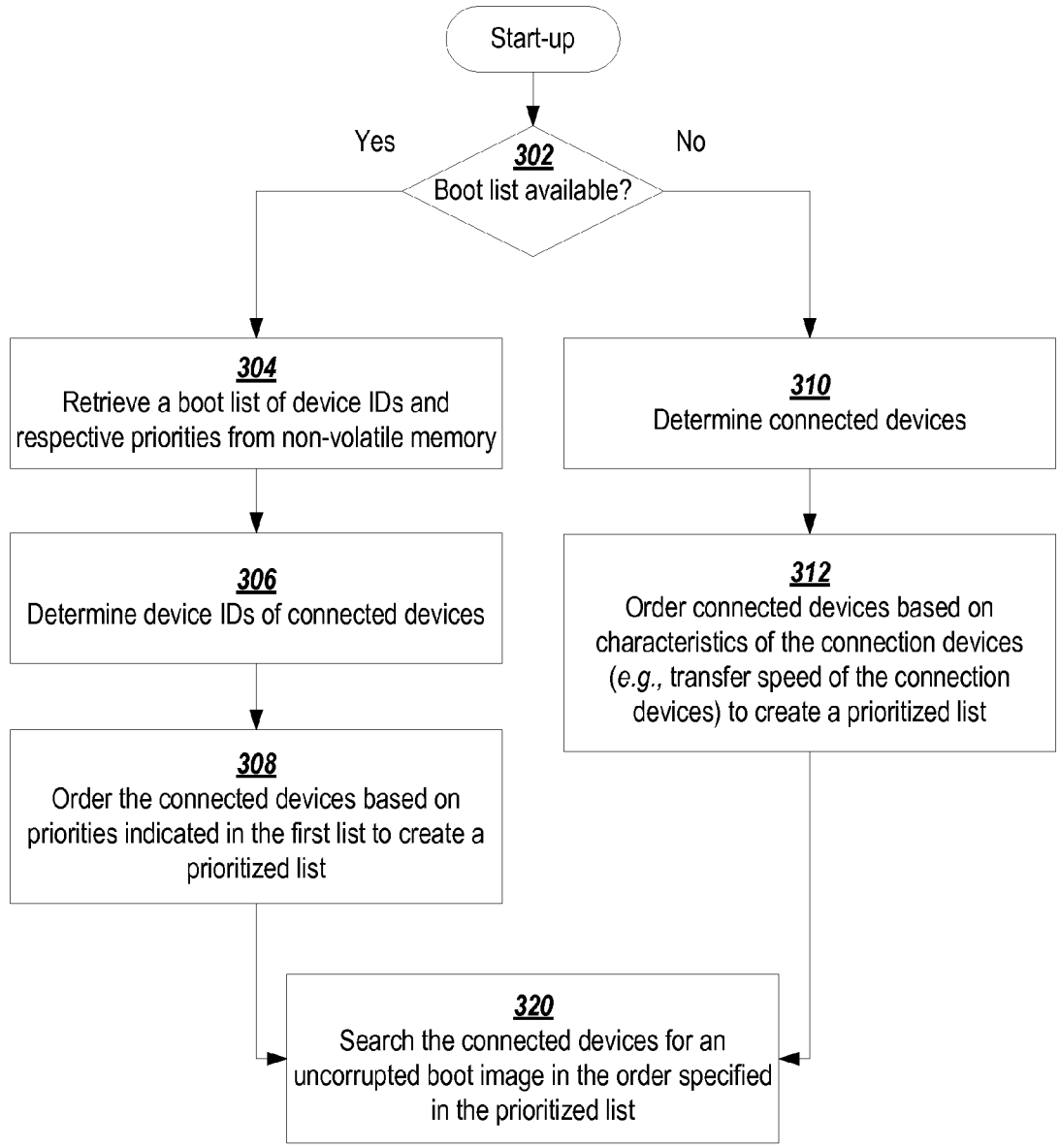
FIG. 3 shows a flowchart of a process for determining an order in which boot devices are searched for an uncorrupt boot image.

FIG. 3 shows a flowchart of a process for determining an order in which boot devices are searched for an uncorrupt boot image. If a boot list is available at startup of a programmable IC, decision block 302 directs the initialization process to retrieve the boot list from a non-volatile memory at block 304. The boot list includes a list of device identifiers (IDs) and respective priorities. Device IDs of connected devices are determined at block 306. At block 308, a list of the connected devices is ordered based on priorities indicated in the boot list to create a prioritized list. At block 320, connected devices are searched for an uncorrupt boot image in the order specified in the prioritized list according to the process of FIG. 2.

If a boot list is unavailable at startup of a programmable IC, decision block 302 directs the initialization process to determine devices connected to the programmable IC at block 310. At block 312, a list of the connected devices is ordered based on various characteristics of the connected devices to produce a prioritized list. For example, some implementations reduce boot times by prioritizing searching of boot devices according to the data transfer rates of the devices. As another example, some implementations may prioritize searching of boot devices based on the status of the boot devices at the time of startup. For instance, lower priorities may be assigned to boot devices that are powered down at the time of startup. As another example, a boot loader circuit may log incidents of failure and prioritize the boot devices based on the logged failure count. An example of an incident of failure is a retrieved boot image being corrupt. Prioritization based on failure count may prevent corrupt boot images from being unnecessarily retrieved each time the programmable IC is started up. Other characteristics of the boot devices may also be used to prioritize the order in which boot devices are searched for boot images at startup. At block 320, connected devices are searched for an uncorrupt boot image in the order specified in the prioritized list.

For ease of explanation, the above examples are primarily described with reference to a single stage initialization process. However, various aspects are also applicable to multi-stage initialization processes, where different boot images are used in different stages. For instance, a first boot image may be used in a first stage to configure a first set of programmable resources to implement a first set of circuits. After completing the first boot stage, a second boot image may be used in a second boot stage to configure a second set of programmable resources to implement a second set of circuits. In some scenarios, one or more of the first set of programmable resources may be reconfigured in the second boot stage to implement one or more of the second set of circuits. In each stage of a multi-stage initialization process, a boot loader circuit may be adapted to search a plurality of boot devices for uncorrupt copies of the respective boot images used in the stage, as described above.

Figure 4:
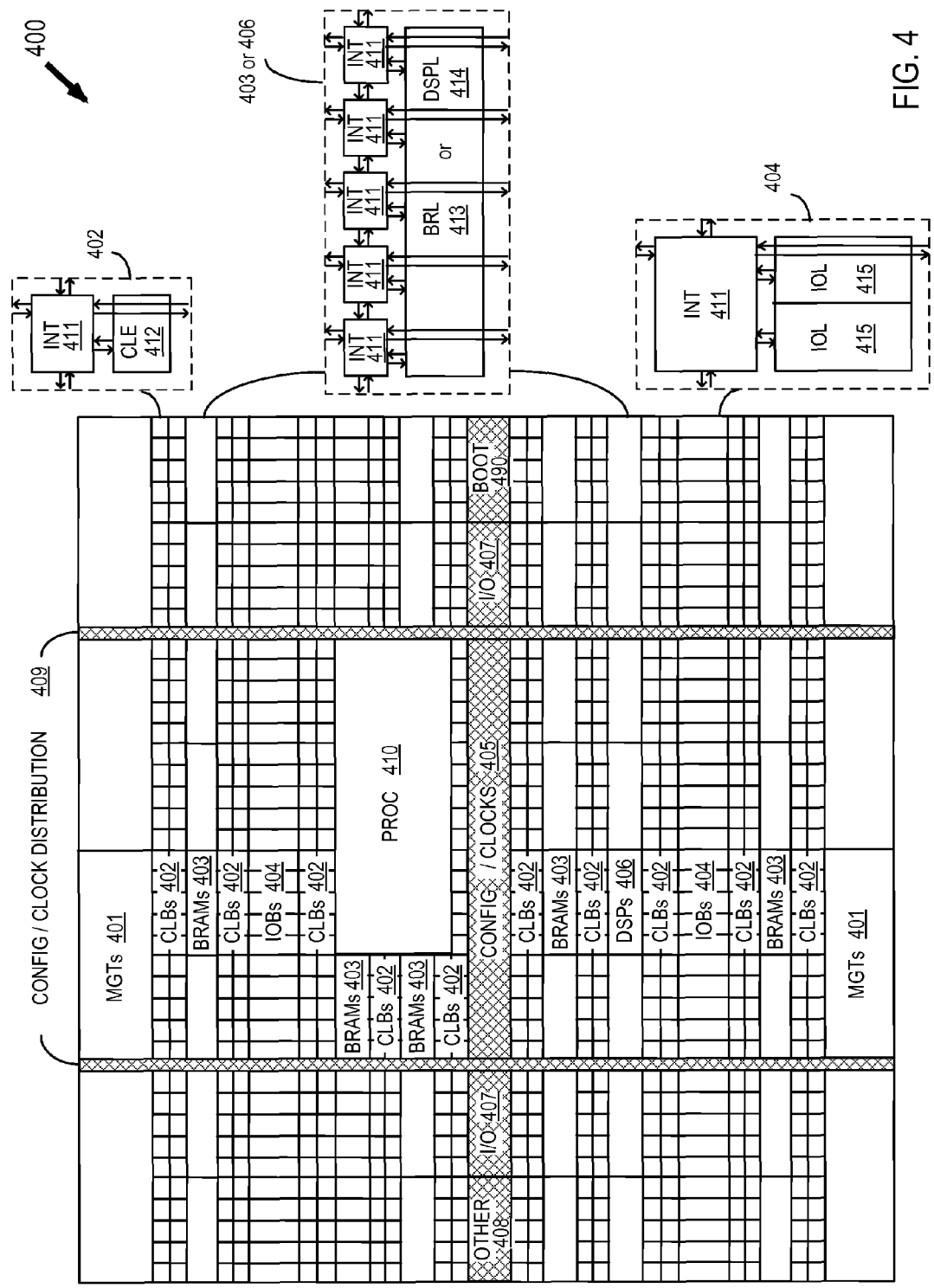
FIG. 4 shows a detailed block diagram of an example programmable IC that may be initialized by searching a plurality of boot devices for an uncorrupt boot image.

As indicated above, the disclosed examples may be applied to a variety of programmable ICs. Although the above examples are primarily described with reference to a programmable IC having an embedded processor, the examples may be adapted for initialization of other types of programmable ICs including, e.g., programmable ICs without a processor or with a processor implemented using programmable hardware resources. FIG. 4 shows a more detailed block diagram of an example programmable IC that may be initialized by searching a plurality of boot devices for an uncorrupt boot image, as described above. The block diagram shown in this example depicts one type of programmable IC known as a field programmable gate array (FPGA). FPGAs can include several different types of programmable logic blocks in the array. For example, FIG. 4 illustrates an FPGA architecture (400) that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), boot loader circuitry (BOOT) 490, digital signal processing blocks (DSPs 406), specialized input/output blocks (I/O 407), for example, e.g., clock ports, and other programmable logic 408 such as digital clock managers, analog-to-digital converters, system monitoring logic, and so forth. Some FPGAs also include dedicated processor blocks (PROC 410) and internal and external reconfiguration ports (not shown).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic plus a single programmable interconnect element INT 411. A BRAM 403 can include a BRAM logic element (BRL 413) in addition to one or more programmable interconnect elements. Typically, the number of interconnect elements included in a tile depends on the width of the tile. In the pictured FPGA, a BRAM tile has the same width as five CLBs, but other numbers (e.g., four) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element INT 411. As will be clear to those of skill in the art, the actual I/O pads connected, for example, to the I/O logic element 415 are manufactured using metal layered above the various illustrated logic blocks, and typically are not confined to the area of the input/output logic element 415.

In the pictured FPGA, a horizontal area near the center of the die (shown shaded in FIG. 4) is used for configuration, clock, and other control logic. Vertical areas 409 extending from this horizontal area are used to distribute the clocks and configuration signals across the breadth of the FPGA.

Some FPGAs utilizing the architecture illustrated in FIG. 4 include additional logic blocks that disrupt the regular row structure making up a large part of the FPGA. The additional logic blocks can be programmable blocks and/or dedicated logic. For example, the processor block PROC 410 shown in FIG. 4 spans several rows of CLBs and BRAMs.

Note that FIG. 4 is intended to illustrate only an exemplary FPGA architecture. The numbers of logic blocks in a row, the relative heights of the rows, the number and order of rows, the types of logic blocks included in the rows, the relative sizes of the logic blocks, and the interconnect/logic implementations included at the top of FIG. 4 are purely exemplary. For example, in an actual FPGA more than one adjacent row of CLBs is typically included wherever the CLBs appear, to facilitate the efficient implementation of user logic.

The methods and system are thought to be applicable to initialization of a variety of programmable ICs. Other aspects and features will be apparent to those skilled in the art from consideration of the specification. For example, although aspects and features may in some cases be described in individual figures, it will be appreciated that features from one figure can be combined with features of another figure even though the combination is not explicitly shown or explicitly described as a combination. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A system-on-chip (SOC), comprising:
   programmable hardware resources disposed on a first integrated circuit (IC) die;
   a configuration control circuit disposed on the first IC die and configured and arranged to, in response to a configuration data stream, program the programmable hardware resources with the configuration data stream;
   a memory circuit disposed on the first IC die;
   a processor disposed on the first IC die, coupled to the memory circuit and programmable hardware resources, and configured and arranged to retrieve and execute instructions from the memory circuit and communicate data with the programmable hardware resources; and
   a boot loader circuit disposed on the first IC die, configured and arranged to:
     search a first boot device, of a plurality of boot devices coupled to and external to the first IC die, for an uncorrupt boot image;
     in response to failing to find an uncorrupt boot image in the first boot device, search a second boot device of the plurality of boot devices for an uncorrupt boot image; and
     in response to finding an uncorrupt boot image, load a set of instructions included in the uncorrupt boot image into the memory circuit.

2. The SOC of claim 1, further comprising:
   a non-volatile memory coupled to the boot loader circuit; and
   wherein the boot loader circuit is configured and arranged to search boot devices of the plurality of boot devices for boot images in an order indicated by a list stored in the non-volatile memory.

3. The SOC of claim 2, wherein the boot loader circuit is further configured and arranged to modify the order of devices indicated in the list in response to control signal values provided to an input of the first IC die.

4. The SOC of claim 2, further comprising:
   an e-fuse disposed on the first IC die; and
   wherein the boot loader circuit is further configured and arranged to:
     prevent modification to the list stored in the non-volatile memory in response to disruption to continuity of the e-fuse; and
     disrupt the continuity of the e-fuse in response to a control signal provided to an input of the IC.

5. The SOC of claim 2, wherein the non-volatile memory is an e-fuse memory.

6. The SOC of claim 1, wherein:
   the boot loader circuit is configured and arranged to perform multiple boot stages including a first boot stage, in which a first set of the programmable hardware resources are configured, and a second boot stage, following the first boot stage, in which a second set of the programmable hardware resources are configured, each boot stage using a respective boot image to configure the corresponding set of the programmable hardware resources; and
   in each of the multiple boot stages, the boot loader circuit is configured and arranged to:
     search for an uncorrupt boot image corresponding to the boot stage in the first boot device; and
     in response to failing to locate an uncorrupt boot image corresponding to the boot stage in the first boot device, searching the second boot device for an uncorrupt boot image corresponding to the boot stage.

7. The SOC of claim 1, wherein the boot loader circuit is configured and arranged to determine if a boot image is corrupt by:
   calculating and verifying a checksum for a header of the boot image; and
   in response to verifying a checksum of the header, calculating and verifying a checksum of a data portion of the boot image.

8. The SOC of claim 1, wherein the plurality of boot devices includes two or more of a quad SPI flash memory, a NAND memory, a NOR memory, and an SD card memory.

9. The SOC of claim 1, wherein the uncorrupt boot image is an encrypted boot image.

10. The SOC of claim 1, wherein, the uncorrupt boot image is an unencrypted boot image.

11. The SOC of claim 1, wherein the boot loader circuit is configured and arranged to:
retrieve a master boot image from the first boot device; and
in response to the master boot image being corrupt, perform the search of the first boot device for an uncorrupt boot image.

12. The SOC of claim 1, wherein the configuration data stream is included in the uncorrupt boot image.

13. The SOC of claim 1, wherein the configuration data stream is provided to the configuration control circuit without the boot loader circuit.

14. An integrated circuit (IC), comprising:
programmable hardware resources disposed on a first IC die;
a configuration control circuit disposed on the first IC die and configured and arranged to, in response to a configuration data stream, program the programmable hardware resources with the configuration data stream; and
a boot loader circuit disposed on the first IC die and configured and arranged to, at power-on of the IC:
search a first boot device, of a plurality of boot devices disposed on respective IC dies coupled to the first IC die, for an uncorrupt boot image;
in response to failing to find an uncorrupt boot image in the first boot device, search a second boot device, of the plurality of boot devices, for an uncorrupt boot image; and
in response to finding an uncorrupt boot image, provide a configuration data stream, included in the uncorrupt boot image, to the configuration control circuit.

15. The IC of claim 14, further comprising:
a memory circuit disposed on the first IC and coupled to the boot loader circuit;
a processor disposed on the first IC, coupled to the memory circuit and programmable hardware resources, and configured and arranged to retrieve and execute instructions from the memory circuit and communicate data with the programmable hardware resources; and
wherein the boot loader circuit is further configured and arranged to load a set of instructions included in the uncorrupt boot image into the memory circuit.

16. The IC of claim 14, further comprising:
a non-volatile memory coupled to the boot loader circuit; and
wherein the boot loader circuit is configured and arranged to:
search boot devices of the plurality of boot devices for boot images in an order indicated by a list stored in the non-volatile memory; and
modify the order of devices indicated in the list in response to control signal values provided to an input of the first IC die.

17. A method of configuring a system-on-chip (SOC) on a first integrated circuit (IC) including programmable hardware resources, a processor, and a memory, the method comprising:
using a boot loader circuit disposed on a first IC:
searching a first boot device, of a plurality of boot devices disposed on respective ICs and coupled to the first IC, for an uncorrupt boot image;
in response to failing to find an uncorrupt boot image in the first boot device, searching a second boot device, of the plurality of boot devices, for an uncorrupt boot image; and
in response to finding an uncorrupt boot image;
loading a set of instructions included in the uncorrupt boot image into the memory; and
in response to finding the uncorrupt boot image, providing a configuration data stream included in the uncorrupt boot image to a configuration controller disposed on the SOC;
using the processor, retrieving and executing the set of instruction loaded into the memory; and
using the configuration controller, configuring the programmable hardware resources of the SOC with a configuration data stream included in the uncorrupt boot image.

18. The method of claim 17, wherein the boot loader circuit is configured and arranged to search boot devices of the plurality of boot devices for boot images in an order indicated by a list stored in a non-volatile memory of the SOC.

19. The method of claim 18, wherein the boot loader circuit is further configured and arranged to modify the order of devices indicated in the list in response to control signal values provided to an input of the SOC.

* * * * *